United States Patent
Budman et al.

[11] Patent Number: 5,872,935
[45] Date of Patent: Feb. 16, 1999

[54] METHOD AND APPARATUS FOR PROVIDING A REMOTELY LOCATED OUTRIGGER CARD ELECTRICALLY COUPLED TO A CONTROL CARD

[75] Inventors: Mark Budman, Vestal, N.Y.; Daniel Joseph Hunt, Cary, N.C.; Mark Joseph Kuzawinski, Maine, N.Y.; David Earl Riehm, Raleigh, N.C.

[73] Assignee: International Business Machines Corporation, Armonk, N.Y.

[21] Appl. No.: 796,003

[22] Filed: Feb. 5, 1997

Related U.S. Application Data

[62] Division of Ser. No. 674,614, Jun. 28, 1996, Pat. No. 5,649,121, which is a continuation of Ser. No. 339,455, Nov. 14, 1994, abandoned.

[51] Int. Cl.⁶ ........................................ G06F 13/00
[52] U.S. Cl. .............................................. 395/282
[58] Field of Search ................... 395/282, 281, 395/283

[56] References Cited

U.S. PATENT DOCUMENTS

| | | | |
|---|---|---|---|
| 5,193,200 | 3/1993 | Asprey et al. | 395/282 |
| 5,440,244 | 8/1995 | Richter et al. | 326/37 |
| 5,555,510 | 9/1996 | Verseput et al. | 364/514 |
| 5,615,328 | 3/1997 | Hadderman et al. | 395/182.2 |

*Primary Examiner*—Meng-Ai T. An
*Assistant Examiner*—David A. Wiley
*Attorney, Agent, or Firm*—Calfee, Halter & Griswold LLP

[57] ABSTRACT

The present invention provides an adapter for utilizing a PCMCIA card in a desktop computer which has at least one card slot and one bay. The adapter includes a logic card configured to be inserted into the card slot of the computer. The logic card has logic thereon to convert PCMCIA bus architecture of the PCMCIA card to the bus architecture of the desktop computer in a bidirectional manner. There may be at least one PCMCIA card receiving slot on the logic card connected to the logic. A first set of external connectors on the logic card is connected to one end of a multi-conductor flexible cable. An outrigger card which includes at least one PCMCIA card is provided which is configured to be inserted into an externally accessible bay of the computer. A second set of connectors on the outrigger card is connected to the opposite end of the multi-conductor flexible cable. Conductors on the outrigger card connect the second set of connectors on the outrigger card to the PCMCIA card receiving slot(s) thereon. Capacitors are connected between at least some of the conductors and a plane maintained at a predetermined voltage on the outrigger card in order to reduce the distortion of the signals received from the flexible conductor at the outrigger card.

4 Claims, 3 Drawing Sheets

METHOD AND APPARATUS FOR PROVIDING A REMOTELY LOCATED OUTRIGGER CARD ELECTRICALLY COUPLED TO A CONTROL CARD

This is a divisional of application(s) Ser. No. 08/674,614, filed on Jun. 28, 1996, U.S. Pat. No. 5,649,121 which is a continuation application of Ser. No. 08/339,455, filed on Nov. 14, 1994 now abandoned.

FIELD OF THE INVENTION

This invention relates generally to computer board circuit configurations, and more specifically to a computer board circuit and outrigger card configuration that allows PCMCIA cards to be utilized with conventional desktop computer architecture and construction.

BACKGROUND ART

Recent advances in notebook and laptop computers have led to the development of the "Personal Computer Memory Card International Associations" (hereinafter PCMCIA) bus standard. The PCMCIA bus can be used not only to connect memory cards to notebook or laptop computers, but also to connect a wide variety of peripheral devices, including modems and other special feature cards to such computer. PCMCIA cards are the approximate size of a typical credit card, and laptop, notebook and other types of portable personal computers have slots for removably receiving PCMCIA cards which are architected to function with the PCMCIA bus of the laptop computers. Thus, the PCMCIA feature cards can be inserted into laptop computers and can be removed for use in other similar computers and to allow other cards to be inserted.

However, one of the problems encountered with the PCMCIA bus architecture and the associate PCMCIA card configuration is that the PCMCIA cards are not compatible either from a bus architecture standpoint or from a physical standpoint with conventional desktop computers which have a variety of different bus architectures such as Micro Channel®, ISA, PCI, etc., as well as slots that are configured to receive different sizes and differently configured add-on or daughter cards. Hence, the PCMCIA card is useful only in laptop or notebook computers configured to receive them, and thus cannot be directly used in conventional desktop computers with other bus architectures and physical configurations. Therefore, when a person wishes to transfer the information in the PCMCIA card which was maintained in a laptop computer and which can contain a work product, it is necessary to electronically transfer the data from the PCMCIA card to some type of add-on card or disc or other media which can be utilized in a desktop computer. Moreover, each time the data is transferred from the PCMCIA card to a card for use in another system, it must be supplied through the card, hard disk or other medium in a form that will allow it to be used by bus architecture of the receiving system.

Accordingly, it would be desirable to have a technique that would allow PCMCIA cards to be utilized not only in laptop and notebook computers having PCMCIA architecture, but also allow the same PCMCIA card be attached directly to a desktop or other computer having different bus architecture from that of the laptop or notebook computer. Moreover, it would be desirable to connect a plurality of such PCMCIA cards into a single card slot on a desktop computer.

To this end, it has been proposed that a conventional card for insertion into a desktop computer be provided with an PCMCIA card adaptor thereon, with required logic on the card to adapt the PCMCIA card to operate on the specific bus architecture of the desktop computer, whether it is ISA, Micro Channel®, PCI, etc. This has found a certain amount of acceptance. However, the number of PCMCIA cards that can actually be physically located on a ISA or similar card in a desktop computer is somewhat limited. Hence, it has been suggested that an outrigger card be provided which can receive several PCMCIA cards therein, with the outrigger card being attached to a bay in the front of the computer with cabling attaching the outrigger card to the ISA or other type bus card inserted into the card slot of the desktop computer. While this does provide additional feature card capability in that PCMCIA cards can be utilized and inserted and removed through bay doors, nevertheless because of the cabling and the inherent impedance in the cabling and other factors which can significantly interfere with reception of the signals on the outrigger card, it has been prior art practice to provide active devices, such as transistors, etc., on the outrigger card so as to process the signals received by the lines and thereby eliminate poor signal quality. While this does solve the problem of poor quality of certain of the signals, nevertheless it adds significantly to the expense of the outrigger card inasmuch as active components must be supplied which are expensive to manufacture and assemble with respect to the outrigger card, thereby adding significantly to the cost of the outrigger card merely to control the quality of the signals received thereon and used by the PCMCIA card.

SUMMARY OF THE INVENTION

According to the present invention, an adapter for utilizing a PCMCIA card in a desktop computer and which desktop computer has at least one card slot and one bay is provided. The adapter includes a logic card configured to be inserted into the card slot of the computer. The logic card has logic thereon to convert PCMCIA bus architecture of the PCMCIA card to the bus architecture of the desktop computer in a bidirectional manner. There may be at least one PCMCIA card receiving slot on the logic card connected to the logic. A first set of external connectors on the logic card is connected to one end of a multi-conductor flexible cable. An outrigger card is provided which is configured to be inserted into an externally accessible bay of the computer. The outrigger card includes at least one PCMCIA card receiving slot. A second set of connectors on the outrigger card is connected to the opposite end of the multi-conductor flexible cable. Conductors on the outrigger card connect the second set of connectors on the outrigger card to the PCMCIA card receiving slot(s) thereon. Capacitors are connected between at least some of the conductors and a plane maintained at a predetermined voltage on the outrigger card in order to reduce the distortion of the signals received from the flexible conductor at the outrigger card.

DESCRIPTION OF THE PREFERRED EMBODIMENT

Figure 1:
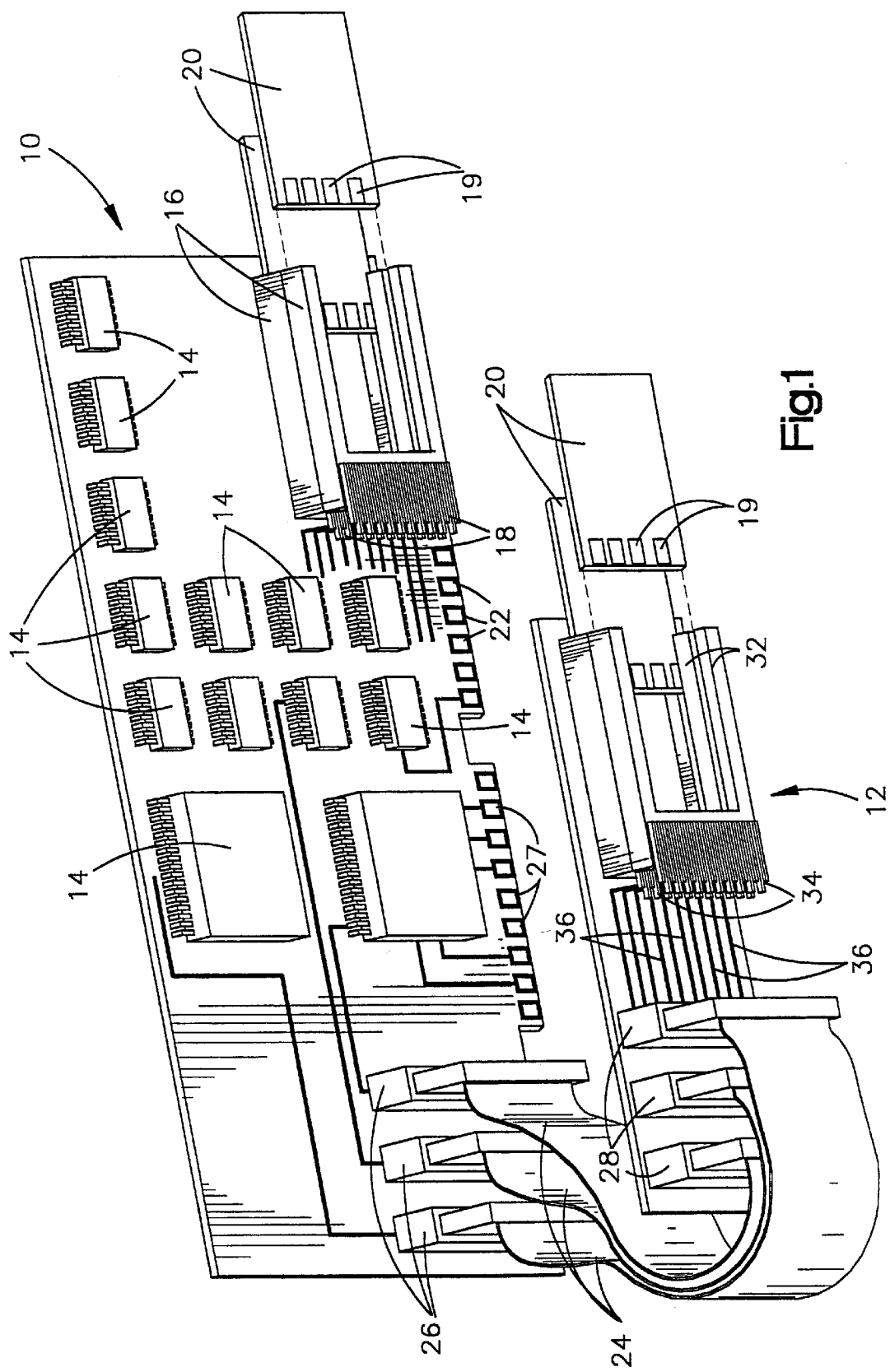
FIG. 1 is a perspective view, somewhat diagrammatic, showing a logic card and an attached outrigger card for insertion into a desktop computer adapted to receive PCMCIA cards on both the logic card and the outrigger card.
Figure 3:
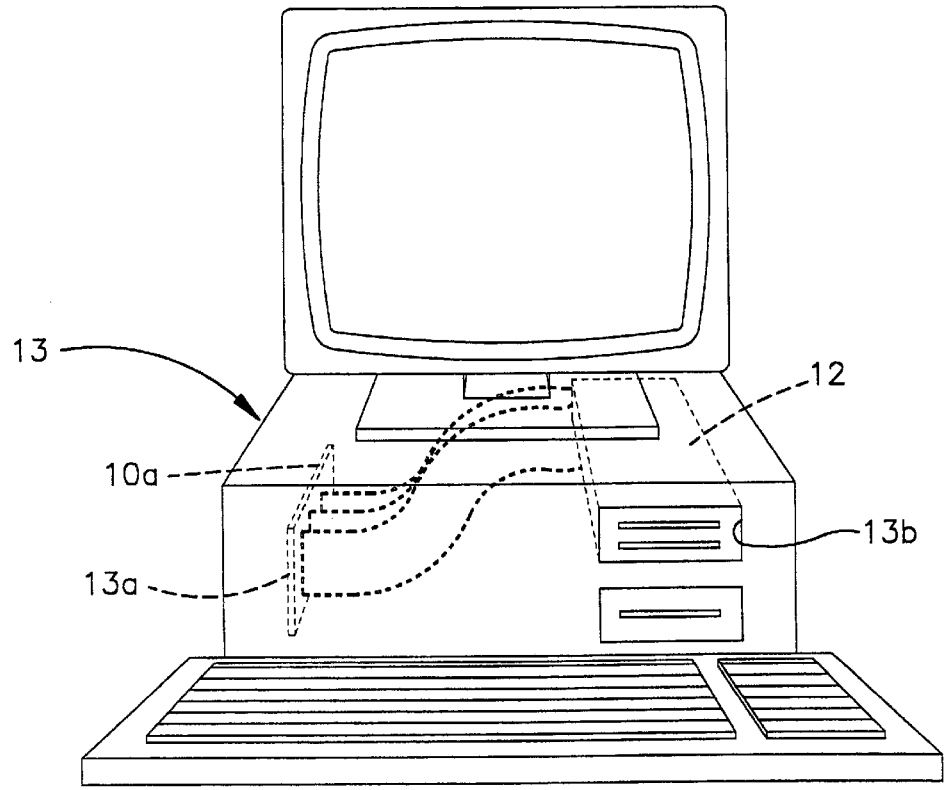
FIG. 3 is a schematic drawing showing the logic card and outrigger card contained in a desktop computer.
Figure 4:
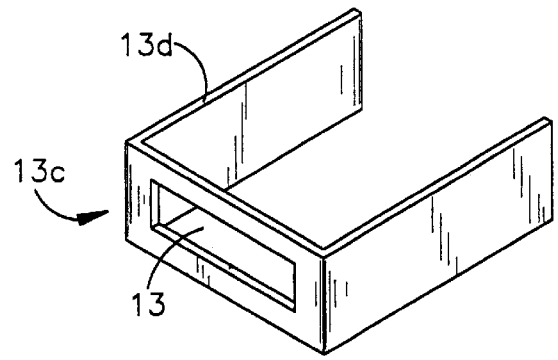
FIG. 4 is a perspective view of a mounting bracket for an outrigger card.

Referring now to the drawings, and for present to FIG. 1, a logic card 10 coupled to an outrigger card 12 is shown. The specific physical configuration of these cards will depend upon the configuration of the slots or bays of the desktop computer 13 (See FIG. 3) into which they are to be fitted, and suitable adapters or racks (FIG. 4) can be provided if required. Such physical configuration of desktop computers may vary somewhat; however, fixtures or adapters can easily be tailored to each configuration. Generally, the logic card 10 is configured to fit into an I/O card slot 13a on a desktop computer as shown in FIG. 3, the configuration of which is standard for the various computers. The outrigger card 12 is configured to fit into the front bay 13b of a desktop computer also as shown in FIG. 3. The outrigger card is configured in such a way as to allow access through the bay door to the PCMCIA card adapter which will be described presently. In any event, the physical configurations of the logic card 10 and the outrigger card 12 are dictated only by the requirement that they be physically configured to fit into the card slots and the bays respectively of the computers to which they are to be attached. Alternatively, if the outrigger card does not fit a card bay in a particular desktop computer, a bracket 13c, as shown in FIG. 4, can be used. The bracket has a frame 13d with an opening 13e thereon, which opening supports an outrigger card 12 for mounting in a bay. Other types of brackets could be employed.

As shown in FIG. 1, the logic card 10 includes thereon various active components 14 which comprise the logic for converting the data and functions on the PCMCIA bus to a form which can be used on whatever system bus is being utilized in the desktop computer. Such a bus architecture could be Micro Channel® (Micro Channel is a registered trademark of International Business Machines Corporation), ISA, PCI or any other type of bus architecture or combination of bus architectures. The specific logic and components 14 for the logic will vary depending upon the bus architecture of the specific desktop computer, but in all cases will convert the format of data in the PCMCIA architecture format to that useful in whatever bus architecture is incorporated in the specific desktop computer.

Preferably, a pair of PCMCIA card adapters 16 are provided on the logic card 10. The adapters 16 are conventional and connected in a stacked configuration such that each can receive a PCMCIA card 20, with each PCMCIA card acting independently. Connectors 18 are provided on the adapters to detachably connect to contacts 19 on PCMCIA cards 20 which can be removably inserted. The connectors 18 are of conventional design of the type used to connect the PCMCIA cards 20 in laptop or notebook computers in which they are utilized directly by the laptop or notebook computers with PCMCIA architecture.

The logic card 10 also has conventional board connectors 22 adapted to connect the logic card 10 to the system board of a desktop computer in a conventional manner.

With the configuration thus far described, if the logic card 10 is plugged into an I/O slot of a conventional desktop computer and one or two PCMCIA cards 20 are inserted in the adapters 16, the logic components 14 on the logic card 10 will allow the desktop computer to utilize each PCMCIA card 20 just as if each were a standard I/O card added to the desktop computer in the I/O slot since the format of the information for the PCMCIA bus contained on the PCMCIA card is converted by the logic to a format useful for the desktop computer. Thus the desktop computer can directly use the information on whatever PCMCIA feature cards 20 are installed.

In order to extend the usefulness of the logic on the logic card 10 to include more PCMCIA cards without the necessity of utilizing additional I/O card slots in the computer, or to provide a location more accessible for inserting and removing PCMCIA cards, the logic card 10 is connected to the outrigger card 12 by one or more flexible cables 24. Such flexible cable can take many different forms, such as twisted pair, ribbon, flex circuit, and the like. Each flexible cable 24 has a plurality of different wires or lines that perform different functions as will be explained presently. Conventionally, these flexible cables may have 50 lines or 80 lines or 100 lines depending upon how many signals have to be carried and how many cables 24 are to be used. These lines include not only signal lines, but power and ground lines to provide all of the necessary I/O information and power to the outrigger card 12. Each flexible cable 24 is connected to contacts 26 on the logic card 10 and termination contacts 28 on the outrigger card 12.

The outrigger card 12 also has a pair of PCMCIA adapters 32 formed thereon in stacked configuration to allow the reception of a pair of PCMCIA cards 20 therein in a manner similar to that in which the cards 20 are received on the logic card 10. The adapters 32 have PCMCIA card connectors 34 which also are conventional connectors adapted to connect to the PCMCIA card 20 and therefore are constructed in the same manner as those connections which are used to connect the PCMCIA card to the laptop or notebook computer. The outrigger card 12 also has conductors or circuit traces, some of which are shown schematically at 36, formed thereon which connect the contacts 28 to the connectors 34 to thus allow transfer of signals to and from the contacts 28 to the PCMCIA cards 20 which are contained in the adapters 32. It is to be understood that there are many more traces 36 than those shown, which are just for illustrative purposes, it being necessary to provide a trace for each line of the flexible cable which is carrying a signal or power.

The outrigger card 12, as previously indicated, is physically configured to fit into the bay 13b of a conventional desktop computer with the end of the card containing the adapters 32 facing outwardly as shown in FIG. 3 so that PCMCIA cards 20 can be readily inserted and removed merely by opening the bay door (not shown) if there is one.

With this configuration, the logic components 14 on the outrigger card 12 can also function to convert the format of the data of PCMCIA cards in the adapters 32 on the outrigger card 12 from PCMCIA bus architecture to a format compatible with the bus architecture of the desktop computer just as it does for the PCMCIA cards 20 contained in the adapter 16 on the logic card 10, the necessary signals and power having been provided through the flexible cable 24 and through the conductors or traces 36.

However, in many instances, there is a problem of certain signals which are received on the outrigger card 12 from the logic card 10 through the cable 24 of being corrupted or degraded. This is due principally to the impedance of the flexible cable 24. The impedance provided by the flexible cable 24 has both a capacitance and an inductive component. It is the inductance component which is primarily responsible for the corruption or degradation of the signals. However, not all the signals are corrupted or degraded to the extent that there is a significant chance of error. Whether a signal will be corrupted or degraded to such an extent that errors are introduced is dependent upon many factors, including the length of time the signal is on the line, the type of signal, location of the line on which the signal is carried, vis-a-vis the other lines, the type of flexible cable, etc. In those lines where the signal is degraded or corrupted, it is necessary to compensate for, i.e., reduce or eliminate, this degradation. As indicated previously, this has been done in the past by providing active components on the outrigger card such as buffers which employ transistors. However, this is expensive. It has been found, however, that the same effect can be achieved by providing a pre-selected capacitance or capacitor of a preselected value between those signal lines or traces where signal degradation or corruption occurs and a given voltage plane, such as a ground plane. This is shown somewhat schematically in FIG. 2, wherein capacitors 38 are shown between various signal lines or traces 36 and a ground plane 42.

While it is possible to theoretically model those lines on which capacitors are needed and the value of the capacitors, nevertheless the variation in the manufacturing tolerances of the various components and other variables such as signal duration in different configurations, whether signals are latched or not, etc., make such predictions somewhat unreliable. Therefore, the preferred technique for determining where added capacitances or capacitors are needed and the values thereof are determined by performing tests and by calculation and subsequent tests to tailor proper capacitance to the proper signal lines or traces 36. In such tests, an outrigger card is constructed which does not have any capacitors on the traces 36, and which is connected with a flexible circuit of the type and length which is to be used in production products. The logic card 10 is then inserted into a computer or test stand and a standard test sequence for testing the computer and the signals is performed utilizing PCMCIA cards in the adapters 32.

Conventional test equipment, including an oscilloscope or signal analyzer and computer programs designed to cause signal transitions on the cable 24 between the logic card 10 and the outrigger card 12, is used to create various signal configurations and monitor the signals on those lines to determine which signals are degraded or corrupted and under what conditions as compared to what these signals should be ideally. The amount of degradation or corruption is determined, and the necessary capacitors are then selected and connected between these lines and a given voltage plane such as a ground plane. In these tests, the noise component is viewed on the screen of the oscilloscope or signal analyzer in a manner well known to those skilled in the art. The fundamental equation for noise analysis is:

$$V = L \times (di/dt)$$

Where: V=Volts
L=Inductance
i=Current, and
t=Time
The fundamental equation for noise suppression is:

$$V = (1/C) \times \int of\ i\ by\ dt$$

where C=capacitance
These equations are well known in the art.

The value of the capacitance for each line is determined in the following manner. First, a logic card and outrigger card are manufactured as in the configuration as previously described, except without any added capacitance between any of the lines 36 and the ground plane or any other plane. The cards are connected by a cable of the selected type and length to be used for production models. PCMCIA cards 20 are then inserted in the adapters 32 on outrigger card 12 and the PCMCIA cards 20 tested in a conventional manner using conventional tests to determine if, in fact, the PCMCIA cards 20 perform their function as designed.

Figure 5A:
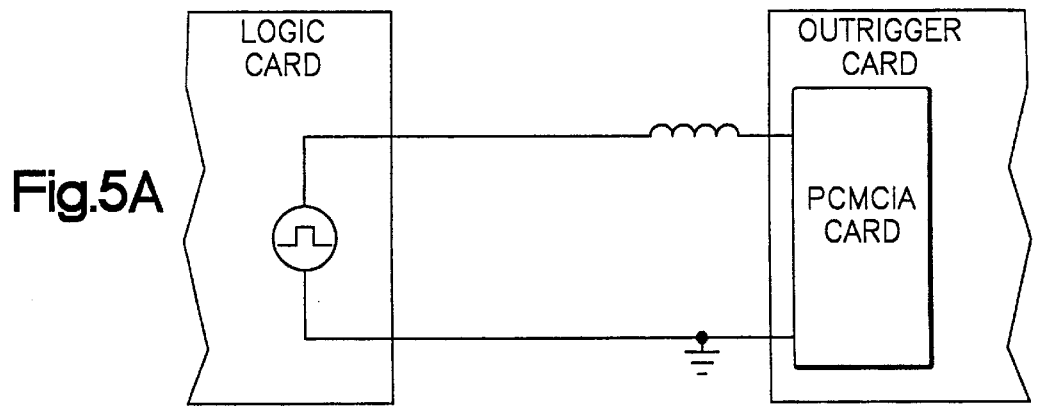
FIGS. 5A, 5B and 5C represent simple, intermediate, and complex models respectively for use in modeling the predicted noise.
Figure 5B:
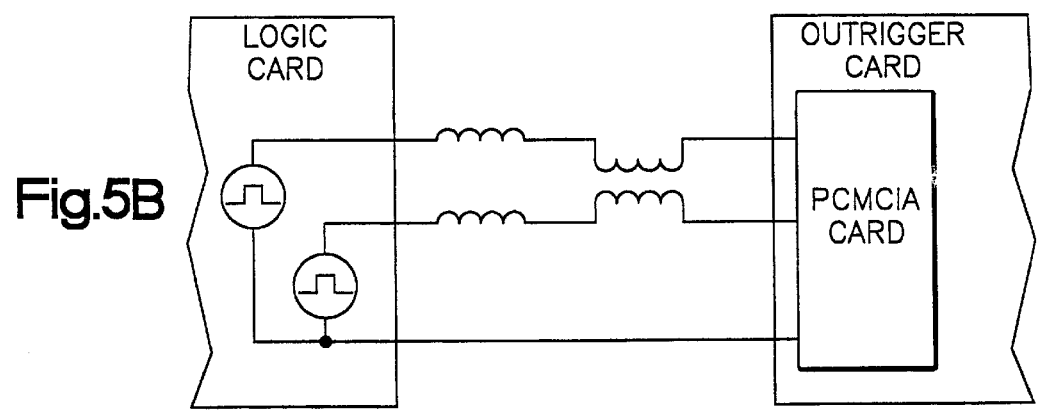
Figure 5C:
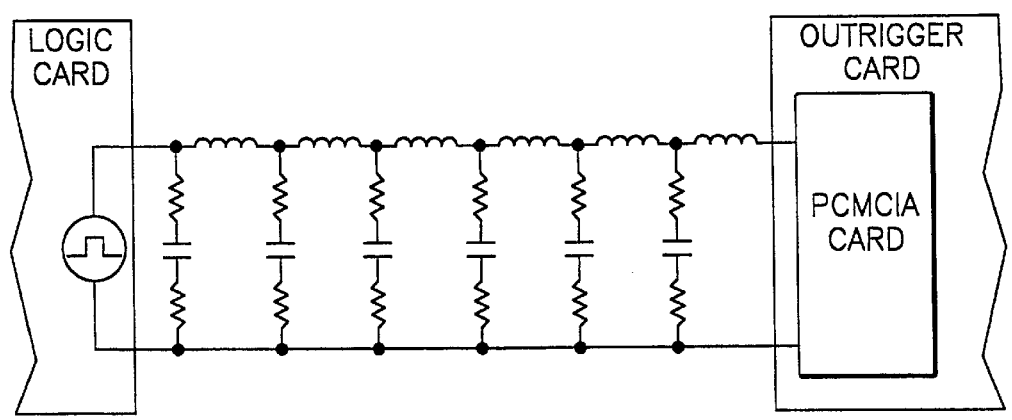

When failure occurs, as it will if no buffers with active components are provided on the outrigger card, the card is then tested with the signals displayed on either an oscilloscope or a logic analyzer. Signals on each of the lines are displayed, and the noise signals correlated to the wave form. This will reveal voltage spikes which are inappropriate for the signal timing shown on the oscilloscope or signal analyzer. These will normally occur on just a few of the many lines, thus revealing which signals are being corrupted or degraded. The theoretical value of the noise can then be calculated by the equation given above for noise suppression. This calculation can be based on a simple model (which is a single lump inductance which is shown schematically in FIG. 5A) or an intermediate model (which is series and coupled inductance as shown in FIG. 5B) or the complex model (which is distributed inductance, capacitance and resistance as shown in FIG. 5C). Whatever model is used, the value of the noise is calculated.

For example, a calculation involving the simple model is as follows. A typical cable used for the preferred implementation is a ribbon cable which has a published nominal inductance of 0.16 micro Henries ($\mu$H) per foot of conductor. A typical rise time for CMOS logic signals is about 6 nanoseconds, and the change in current is typically about 8 milliamps over the rise time. The length of the cable is then measured, which in a typical example may be 24". Substituting these values in the noise analysis equation to solve the noise level $$V = \frac{(.32 \times 10^{-6}) \times (8 \times 10^{-3})}{6 \times 10^{-9}} = 426.6\ millivolts$$

Thus, the calculated noise using the simple model is 426.6 millivolts.

The amount of capacitance theoretically required is then determined using the above noise suppression equation for determining capacitance C, which when solved, C=1×10$^{-12}$ farads or 1 picofarad. This gives the value to try which would be the theoretical value of capacitance necessary to suppress the noise on this particular signal line.

Next, a capacitor of 1 picofarad is connected between the signal line 36 on the outrigger card 12 and ground, and the same test is rerun. (It is to be understood that each of the lines having excessive noise level would have the value of the theoretical capacitors required to eliminate the noise calculated, and a capacitor of this value coupled between each of the lines and ground.) During retesting, the signals are again observed on the oscilloscope or signal analyzer. If the calculated value of the capacitor reduces the noise to an acceptable level, then this is the value of the capacitor left on that particular line 36. However, many of the lines will still have noise above the acceptable level, even with this calculated theoretical value of capacitance added. This is due to many factors, including the interaction of various lines which are adjacent to each other, time of signals, frequency, the latching of signals, etc.

All of the signal lines are observed on the oscilloscope or signal analyzer, and those that still have voltage spikes above the acceptable level are identified and a capacitor of higher value is substituted for the original capacitor. This value will depend on how much the noise value has been reduced; the less the value reduction of the noise level, the higher the value of the capacitor. For example, the value of 1,000 picofarads could be tried for those lines still having unacceptably high values. The outrigger card is then modified to have these revised values of capacitors connected between the necessary lines 36 and ground, and the test is again run. If there are still some lines that have a noise level which is too high as revealed by the signal trace on the oscilloscope, even larger capacitors can be used and, in certain cases, these values are as high as 0.1 microfarad or even higher.

Finally, when all the noise values have been reduced by this process to below a level that which will cause unacceptable signal degradation or unacceptable performance, the final values are built into a card and the card tested, and when the card passes the test the cards are then manufactured for these values of capacitors.

It should be noted that it is not possible just to put a very large value of capacitor across each line, since, if the value becomes too large, this could adversely affect the timing of the signals and the operation of the circuit with the various circuit drivers.

It is to be understood that the other models, such as the intermediate and the complex models, could be used for the initial calculations which, in many instances, will give a closer value to the actual end result than using the simple model. Nevertheless, none of models is completely accurate for the many reasons discussed above, and thus give only a first approximation, which in many cases can be significantly different from the final level or value of capacitors required. The intermediate and complex models, as well as a transmission line model, which is extremely advanced, can be more efficiently calculated by using a mathematical modelling program such as the "MathCad" by Mathsoft for use on a PC or Electrical System Modeling Program "PSPICE" by MicroSim also for use on a PC. These programs are well known and will provide the necessary first calculations.

The capacitor values of these calculations, as indicated above, must be subjected to tests and modified where required to reflect the actual operating condition of the lines, and thus provide the required values of the capacitors for each of the lines. Since none of these models, even the most complex, produces results which are sufficiently close to the actual values as determined by tests, in most instances the simple model is satisfactory as a starting point which simplifies the calculations and allows a reasonable starting point for varying the values.

Figure 2:
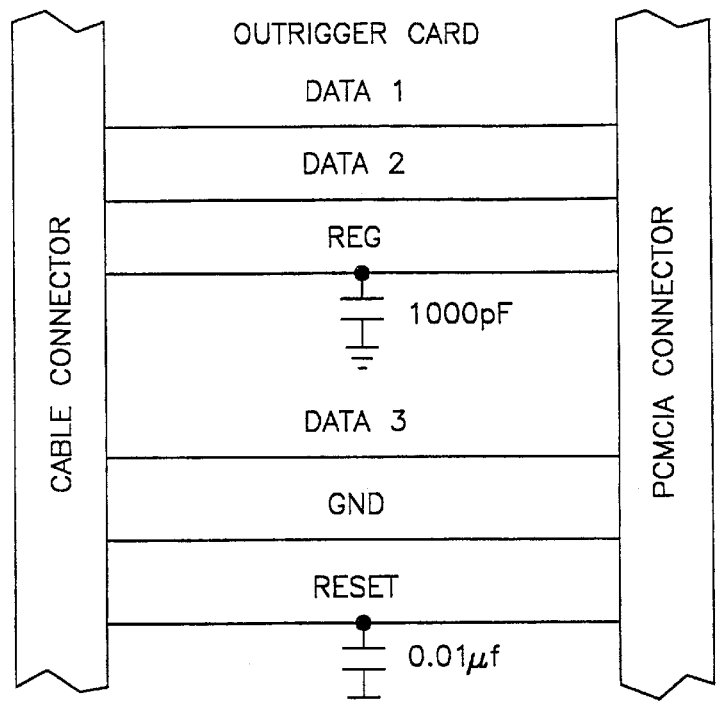
FIG. 2 is a detailed view, somewhat schematic, of a portion of the outrigger card showing a connection of capacitors between various lines on the card and the ground plane.

FIG. 2 shows typical values of capacitors which may be utilized in certain instances with certain types of cable. For example, based on tests performed, the capacitor used between the reset line and ground has a value of 0.01 uf, while the capacitor between the REG line and ground has a value of 1,000 pf. It is to be understood that there are many more lines and that not all of them need to have capacitors. The above-described tests on the outrigger card, without capacitors but as the card 20 is otherwise designed utilizing the intended flexible circuit, will indicate which lines need to have capacitors thereon, and the test will further indicate the value of the capacitors. Thus, an outrigger card can be constructed and attached to the logic card wherein the outrigger card need not have any active components, but need only capacitors on those lines where necessary, which capacitors are relatively inexpensive and easy to install. Thus, the cost of the outrigger card is significantly reduced.

Accordingly, the preferred embodiment of the present invention have been described. With the foregoing description in mind, however, it is understood that this description is made only by way of example, that the invention is not limited to the particular embodiments described herein, and that various rearrangements, modifications, and substitutions may be implemented without departing from the scope of the invention as hereinafter claimed.

What is claimed is:

1. A method of forming an adapter for utilizing a PCMCIA card having PCMCIA bus architecture thereon, in a desktop computer which has at least one logic card slot and one bay and which bus architecture is different from the PCMCIA bus architecture, comprising the steps of:

a. providing logic circuitry for converting a PCMCIA bus to the bus architecture of a desktop computer;

b. providing an outrigger card having at least one PCMCIA card adapter thereon;

c. connecting said outrigger card to said logic circuitry by a flexible cable having a plurality of wires for bidirectional conveying of signals by said wires;

d. providing a plurality of conductors on said outrigger card connecting the wires of said cable to said PCMCIA card slot;

e. inserting a PCMCIA card in said PCMCIA slot;

f. generating signals between said logic circuitry and said PCMCIA card slot over said cable and said conductors;

g. determining which signals have a noise component greater than a predetermined minimum;

h. calculating the value of noise component of each signal having a value greater than the predetermined minimum, i. calculating the value of a capacitor which would theoretically eliminate the value of each of said signal noise components;

j. providing a capacitance equal to the calculated value across each of the conductors for which the value was calculated and a plane on a predetermined voltage;

k. redetermining which of said signals on the conductor having a capacitor across the conductors have a noise value above said preselected level;

l. increasing the capacitance on each conductor when said redetermined value of step k is greater than said predetermined value; and m. repeating steps k and l until the noise level is below said preselected level for all conductors.

2. The method as defined in claim 1 wherein the noise component value calculation in step h is calculated using the equation:

$$V = L(di/dt)$$

Where: V=Volts

L=Inductance i=Current, and t=Time.

3. The method as defined in claim 1 wherein the calculation of the value of the capacitor in step i is calculated using the equation $$V = (1/C) \times \int i \, by \, dt$$

where C=Capacitance i=Current t=Time.

4. The method as defined in claim 1 wherein the noise component value calculation in step h is calculated using the equation:

$$V = L(di/dt)$$

Where: V=Volts
L=Inductance
i=Current, and
t=Time and the calculation of the value of the capacitor in step i is calculated using the equation $$V = (1/C) \times \int i \, by \, dt$$

where C=Capacitance
i=Current
t=Time.

* * * * *